(12) United States Patent
Zanikopoulos et al.

(10) Patent No.: US 10,014,875 B1
(45) Date of Patent: Jul. 3, 2018

(54) ANALOG-TO-DIGITAL CONVERTER

(71) Applicant: NXP B.V., Eindhoven (NL)

(72) Inventors: Athon Zanikopoulos, Riethoven (NL); Erwin Janssen, Veldhoven (NL); Konstantinos Doris, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/849,856

(22) Filed: Dec. 21, 2017

(30) Foreign Application Priority Data

Dec. 29, 2016 (EP) .................................... 16207359

(51) Int. Cl.
*H03M 1/12* (2006.01)
*H03M 1/10* (2006.01)
*H03M 1/00* (2006.01)
*H03M 1/44* (2006.01)
*H03M 1/36* (2006.01)
*H03M 1/46* (2006.01)

(52) U.S. Cl.
CPC ......... *H03M 1/1009* (2013.01); *H03M 1/001* (2013.01); *H03M 1/002* (2013.01); *H03M 1/1071* (2013.01); *H03M 1/1245* (2013.01); *H03M 1/44* (2013.01); *H03M 1/361* (2013.01); *H03M 1/468* (2013.01)

(58) Field of Classification Search
CPC .. H03M 1/1009; H03M 1/002; H03M 1/1245; H03M 1/44; H03M 1/1071; H03M 1/001; H03M 1/361; H03M 1/468; H03M 1/10; H03M 1/00; H03M 1/12; H03M 1/36; H03M 1/46
USPC .................................. 341/133, 155, 117–120
See application file for complete search history.

(56) References Cited

U.S. PATENT DOCUMENTS

| 7,061,421 B1 * | 6/2006 | Xiao ..................... H03M 1/363 341/155 |
| 2010/0079318 A1 | 4/2010 | Berens et al. |
| 2010/0164770 A1 * | 7/2010 | Wan .................... H03M 1/0607 341/133 |

* cited by examiner

*Primary Examiner* — Jean B Jeanglaude
(74) *Attorney, Agent, or Firm* — Rajeev Madnawat

(57) ABSTRACT

An analog-to-digital converter including a converter arrangement configured to provide a digital output signal as an output of the analog-to-digital converter based on an analog input signal comprising an input to the analog-to-digital converter, the analog-to-digital converter including a calibration module configured to provide calibration signalling to set one or more of a gain of one or more components of the converter arrangement and an offset of one or more components of the converter arrangement, the calibration module further configured to provide, as an output, diagnostic information based on the calibration signalling for use in determining the occurrence of a fault in the analog-to-digital converter.

15 Claims, 1 Drawing Sheet

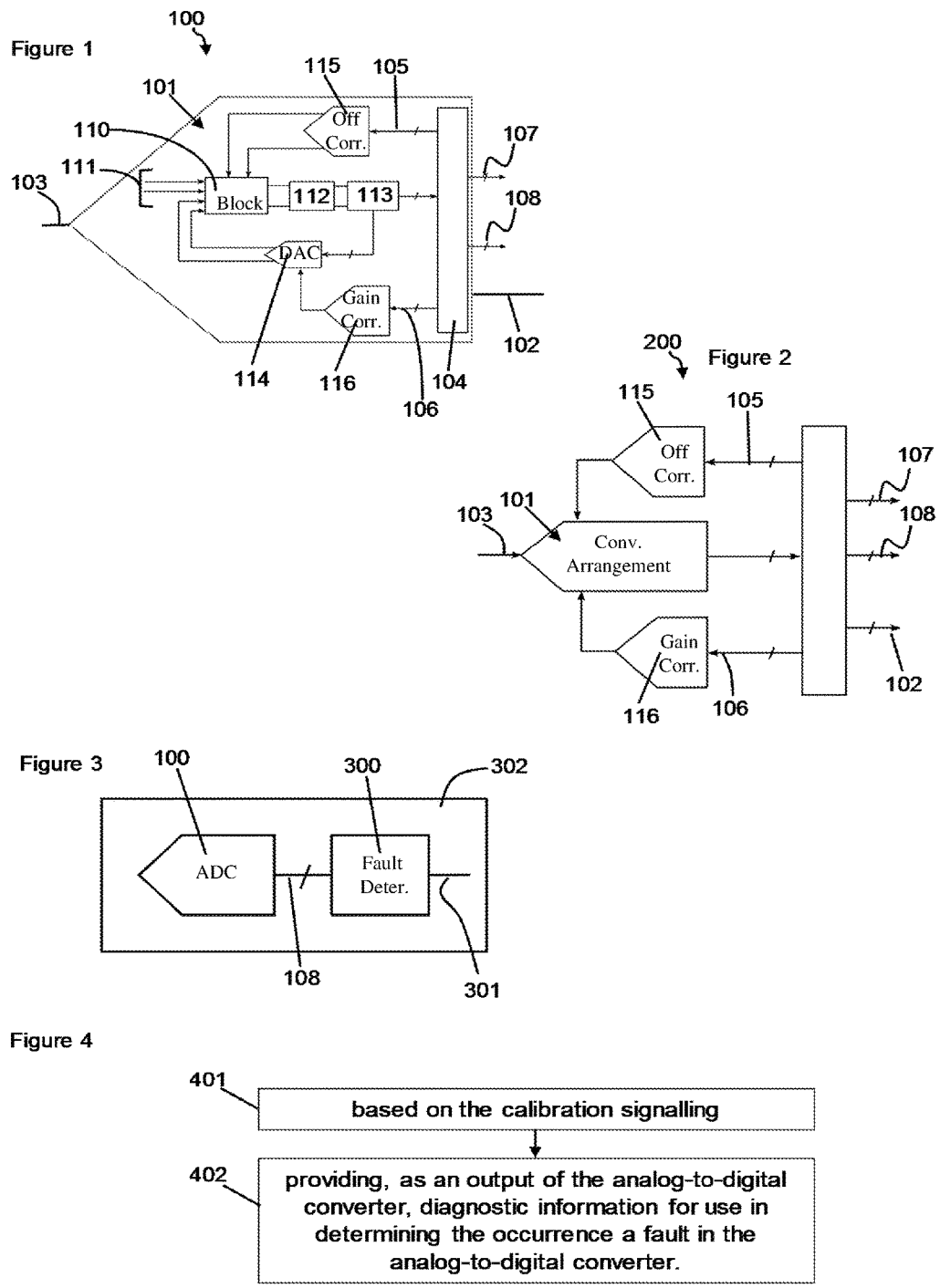

ANALOG-TO-DIGITAL CONVERTER

CROSS-REFERENCE TO RELATED APPLICATIONS

This application claims the priority under 35 U.S.C. § 119 of European Patent application no. 16207359.7, filed on Dec. 29, 2016, the contents of which are incorporated by reference herein.

The present disclosure relates to an analog-to-digital converter. In particular, in one or more embodiments, it relates to an analog-to-digital converter configured to provide diagnostic information for determination of the occurrence of a fault in the analog-to-digital converter.

According to a first aspect of the present disclosure there is provided an analog-to-digital converter including a converter arrangement configured to provide a digital output signal as an output of the analog-to-digital converter based on an analog input signal comprising an input to the analog-to-digital converter, the analog-to-digital converter including a calibration module configured to provide calibration signalling to set one or more of a gain of one or more components of the converter arrangement and an offset of one or more components of the converter arrangement, the calibration module further configured to provide, as an output, diagnostic information based on the calibration signalling for use in determining the occurrence of a fault in the analog-to-digital converter.

In one or more embodiments, the calibration module is configured to provide said diagnostic information to one or more diagnostic output pins of the analog-to-digital converter for connection to a fault determination module for interpretation of the diagnostic information to determine the occurrence of a fault.

In one or more examples, the calibration module is thus connectable to the fault determination module. In one or more examples, the diagnostic information comprises a digital signal.

In one or more embodiments, the analog-to-digital converter includes a fault determination module configured to receive the diagnostic information from the calibration module and identify the occurrence of a fault within the analog-to-digital based on one or more fault conditions and, on occurrence of a fault, provide, as an output, a fault signal.

In one or more examples, the fault determination module is integrated with the calibration module.

In one or more embodiments, the analog-to-digital converter includes an offset correction module which is, based on the calibration signalling, configured to apply an offset signal to the convertor arrangement to compensate for a voltage and/or current offset determined by the calibration module.

In one or more embodiments, the analog-to-digital converter includes a gain correction module which is, based on the calibration signalling, configured to apply a gain signal to the convertor arrangement to adjust the gain thereof.

In one or more embodiments, the calibration module is configured to determine the calibration signalling based on one or more of;
  i) a comparison between the analog input signal and the digital output signal for a known analog input signal for determination of the offset;
  ii) averaging of the digital output signal over time for determination of an offset;
  iii) a comparison between the analog input signal and the digital output signal for at least two known analog input signals or at least two known component parts of the analog input signal for determination of the gain;
  iv) statistical analysis of the digital output signal for determination of the gain and/or offset.

In one or more embodiments, the analog-to-digital converter is configured to provide said diagnostic information based on a test analog input signal.

In one or more embodiments, the analog-to-digital converter is configured to provide said diagnostic information in real time during operation of the analog-to-digital converter.

Thus, in one or more examples, in addition or alternative to testing performed in response to powering up of the analog-to-digital converter, the calibration module may be configured to repeatedly, periodically or in response to changes in diagnostic information, provide said diagnostic information for use in determining the occurrence of a fault in the analog-to-digital converter.

In one or more embodiments, the convertor arrangement includes one or more of;
  i) a pre-amplifier configured to provide an amplified output signal based on an input signal;
  ii) a buffer configured to receive the analog input signal and a feedback signal generated by the convertor arrangement;
  iii) a sampling module configured to sample an analog signal;
  iv) a digital to analog converter configured to output one of a voltage and current that approximates the sampled input signal;
  v) a Successive-approximation-register configured to implement a Successive approximation algorithm.

In one or more embodiments, the converter arrangement includes a digital-to-analog converter and the calibration signalling is configured to adjust a gain of the digital-to-analog converter by application of a bias signal thereto.

In one or more embodiments, the offset of the converter arrangement is defined by the offset of one or more of a pre-amplifier, a buffer, a comparator and a digital-to-analog converter of the converter arrangement.

In one or more embodiments, the fault determination module comprises a functional safety monitor for receiving the diagnostic information.

According to a second aspect of the present disclosure there is provided the analog-to-digital converter of the first aspect in combination with a fault determination module, the fault determination module configured to provide a fault signal based on one or more fault conditions, the fault conditions at least comprising that the diagnostic information indicates that the one or more of a gain and an offset of the converter arrangement are outside a predetermined range of acceptable values.

According to a third aspect of the present disclosure there is provided method of operation of an analog-to-digital converter including a converter arrangement configured to provide a digital output signal as an output of the analog-to-digital converter based on an analog input signal comprising an input to the analog-to-digital converter, the analog-to-digital converter including a calibration module configured to provide calibration signalling to set one or more of a gain of one or more components of the converter arrangement and an offset of one or more components of the converter arrangement, the method comprising:
  based on the calibration signalling;
  providing, as an output of the analog-to-digital converter, diagnostic information for use in determining the occurrence of a fault in the analog-to-digital converter.

According to a fourth aspect of the present disclosure there is provided radar device including the analog-to-digital converter of the first aspect or the combination of the second aspect, the radar device configured to use the digital output of the analog-to-digital converter for providing radar functionality.

In one or more examples, the radar device comprises an automotive radar device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 1 shows an example embodiment of an analog-to-digital converter;

FIG. 2 shows a simplified example embodiment of an analog-to-digital converter;

FIG. 3 shows an embodiment of an analog-to-digital converter with a functional safety monitor, which happens to be part of an automotive radar system;

FIG. 4 shows an example method.

Analog-to-digital converters are often used, but not exclusively, in the capture of information from sensors. An analog-to-digital converter provides a digital output signal based on an analog input signal for subsequent processing in the digital domain. The effective functioning of the analog-to-digital converter is important, especially if the subsequent processing is reliant on digital signals that are accurately representative of the analog signals. As an example, the analog-to-digital converter may be part of an automotive radar system. Automotive radar systems are becoming more common to implement functionality such as adaptive cruise control, automatic emergency braking and autonomous driving. It is important that components work effectively when employed in safety critical roles.

FIG. 1 shows a schematic block diagram of an example embodiment of an analog-to-digital converter 100 (hereinafter "ADC"). The ADC 100 includes a converter arrangement 101 configured to provide a digital output signal at an output 102 of the ADC 100 based on an analog input signal at an input 103 to the ADC 100. The structure of the converter arrangement 101 that provides the analog to digital conversion may take any required form and various converter arrangements will be known to those skilled in the art. The converter arrangement 101 does however include a calibration module 104 configured to provide calibration signalling (shown as 105, 106). The calibration signalling may be used to provide for configuration of the function of components of the ADC 100 such as by setting parameters used by the converter arrangement in the process of converting the analog input signal to the digital output signal. In particular, the converter arrangement 101 may be configured to receive the calibration signalling from the calibration module 104 to set one or more of i) a gain of one or more components of the converter arrangement 101; and ii) a voltage and/or current offset of one or more components of the converter arrangement 101.

Thus, the converter arrangement 101 may include one or more of an amplifier and a digital-to-analog converter (and any other component) that have adjustable gain. The converter arrangement 101 may include one or more of an amplifier and a digital-to-analog converter (and any other component) that have adjustable voltage or current offset that provides for configuration of their function based on the calibration signalling mentioned above.

The calibration module 104 is further configured to provide, at an output 107, 108 of the analog-to-digital converter, diagnostic information based on the calibration signalling for use in determining the occurrence of a fault in the analog-to-digital converter 100. Thus, not only does the calibration module calculate and provide calibration signalling for internal adjustment of one or more components of the converter arrangement 101, but it is also configured to provide an output for diagnostic information for fault detection.

In one or more examples, the calibration signalling takes the form of one or more predetermined codes that are used, internally to the converter arrangement 101, to adjust the gain and/or offset. In one or more examples, the diagnostic information may comprise those same one or more predetermined codes. In one or more other examples, the calibration module 104 may be configured to translate the calibration signalling into a different form, such as predetermined diagnostic codes different to the predetermined codes, for interpretation by a fault determination module.

The output of diagnostic information based on internal calibration processes to set gain and/or offset within the one or more components of the converter arrangement 101 is advantageous. The diagnostic information may be used to diagnose integrated circuit based faults, where the ADC 100 is implemented on an integrated circuit. The diagnostic information may be used to determine i) total loss of functionality and ii) performance degradation, which for automotive radar applications may result in false detection and/or reduced sensitivity.

In this example, the calibration module 104 is configured to provide said diagnostic information to the outputs 107, 108. The outputs 107, 108 comprise two sets of diagnostic output pins 107, 108 respectively, of the analog-to-digital converter 100. In one or more examples, only one set of pins may be provided to provide the outputs of one or both of pins 107, 108 of this example. The output pins 107, 108 may provide for connection to a fault determination module 200 (shown in relation to FIG. 2 and described below) for interpretation of the diagnostic information to determine the occurrence of a fault. In other examples, different numbers or different number of sets of pins are made available for communicating the diagnostic information. In this example, the output pins 107 are for connection to a fault determination module configured for production testing. In this example, the output pins 108 are for connection to a fault determination module configured for functional safety monitoring.

It will be appreciated that while in this example, the ADC 100 provides output pins for connection of a fault determination module that interprets the diagnostic information, in one or more other embodiments, the fault determination module may be internal to or integrated with the ADC 100.

Whether internal to the ADC 100 or connected to the output pins 107, 108, the fault determination module (shown in FIG. 3) may be configured to receive the diagnostic information from the calibration module 104 and identify the occurrence of a fault within the ADC 100 based on one or more fault conditions and, on occurrence of a fault, provide, as an output, a fault signal at output 301.

Thus, the fault conditions may include;
i) if the predetermined codes are saturated (meaning all '0' or all '1') it may be indicative of a totally failed ADC 100, since this means that the ADC is not effectively calibrating itself. This may manifest itself as non-linearity and noise.
ii) if the predetermined codes or, more generally, the diagnostic information deviates from predefined acceptable ranges.

The predefined ranges may enable some degradation in performance to be tolerated but the identification of unacceptable deviations in performance to be identified. The predefined acceptable ranges may be set depending on the application or expected performance of the ADC 100.

The fault signal may be used to provide one or more of: a user indication informing them of a fault; the resetting of the ADC 100; the resetting of a device of which the ADC 100 forms part; the shutting down of the ADC 100; and the shutting down of the device of which the ADC 100 forms part. Such actions may be appropriate for fault monitoring during use of the ADC. In the case of production testing the generation of the fault signal may be used to provide for: i) discarding the tested ADC 100 in case the fault is outside a predetermined range and/or ii) separation of better/worse performing ADCs 100 ("binning").

As mentioned above, the component structure of the converter arrangement 101 may be of any suitable form. However, several components that may be provided are described below. The converter arrangement may comprise one or more of a buffer, sampling module and one or more pre-amplifiers, shown collectively as 110. The block 110 is shown receiving the analog input signal of the ADC 100 at 111. It will be appreciated that FIG. 1 shows a pair of connections extending between the functional blocks to represent a differential configuration. However, it will be appreciated that in other configurations of converter arrangement a single connection may be provided between the functional blocks rather than a differential configuration.

The buffer, in this example, is configured to receive the input signal and a feedback signal generated by the convertor arrangement. The buffer may amplify the difference between the signal for subsequent processing by the converter arrangement 101.

In this example, the sampling module is configured to sample the analog input signal.

The pre-amplifier(s) are configured to provide an amplified output signal based on an input signal.

The converter arrangement 101 includes a comparator module 112 configured to detect zero crossings in the input signal based on the output of the buffer. The output of the comparator module 112 may comprise a logic zero or logic one. The output of the comparator module 112 is provided to a successive-approximation-register controller 113. The successive-approximation-register controller 113 may be configured to operate in a step-wise manner and receive the output of the comparator module for each step. The successive-approximation-register controller 113 implements a successive approximation algorithm, controlling the digital to analog converter 114 in a way that approximates, step-by-step, the sampled input signal. The output of the successive-approximation-register controller 113 is provided to a digital to analog converter (DAC) 114, which feeds back to one or more of the buffer, sampling module and one or more pre-amplifiers, shown collectively as 110. The DAC 114 is configured to output a voltage or current that approximates the sampled input signal.

It will be appreciated that one or more of the buffer, sampling module and one or more pre-amplifiers, comparator module 112, successive-approximation-register controller 113 and DAC 114 may be configurable to adjust one or more of their gain and voltage or current offset, as appropriate. It will be appreciated that the converter arrangement 101 may include some, all or other components to effect the analog-to-digital conversion.

In the present example, the ADC 100 includes an offset correction module 115 comprising a digital-to-analog converter which is, based on the calibration signalling from the calibration module 104, configured to apply an offset signal to the convertor arrangement 101 to compensate for a voltage or current offset determined by the calibration module. The offset correction module 115, in this example, is configured to receive a predetermined digital code from the calibration module. The offset correction module 115 is configured to convert the digital code into the analog, offset signal for applying to one or more of the components of the converter arrangement 101. In the present example, the correcting, offset signal is applied to one or more of the buffer, sampling module and one or more pre-amplifiers, shown collectively as 110. Accordingly, the voltage or current provided by the module 115 is configured to provide a predetermined or required change in the function of the component on which it acts by control of its offset.

Further, in the present example, the ADC 100 includes a gain correction module 116 comprising a digital-to-analog converter which is, based on the calibration signalling from the calibration module 104, configured to apply a gain signal to one or more components of the converter arrangement 101 for adjusting the gain applied by said one or more components. Thus, the calibration module 104 may be configured to determine that adjustment of gain is required and provide the calibration signalling, comprising a predetermined digital code, to the gain correction module 116. The gain correction module 116 may be configured to convert the digital code of the calibration signalling into the analog, gain signal for application to one or more of the components of the converter arrangement. The gain signal may be applied to bias a component, for example. In the present example, the correcting, gain signal is applied to the DAC 114. The gain signal is, in this example, configured to apply a bias signal to the DAC 114.

In this example, the gain correction module DAC 116 and the offset correction module DAC 115 are used to apply the calibration signalling to the components of the converter arrangement 104. However, in other examples, the calibration signalling output by the calibration module may be applied directly to the one or more components of the converter arrangement 104 or via one or more passive or active components. Thus, the gain correction module 116 and the offset correction module 115 may be considered, more generally, as actuators for implementing the calibration signalling.

The calibration module 104 is configured to receive input from the successive-approximation-register controller 113. The output from the block 113 may comprise the output of the ADC, although in one or more examples, further processing may be performed before output 102 is generated. However, the output from the block 113 provides information relating to the operation of the converter arrangement 101 that the calibration module 104 may base the calibration signalling.

The calibration module 104 may be configured to calibrate the gain and/or offset using a variety of techniques. It will be appreciated that the following provides an example of the techniques that may be employed by the calibration module and other techniques for calibrating the internal components of the ADC may be used. For example, a different structure of converter arrangement 101 may require different calibration techniques.

In one or more examples, the calibration module 104 is configured to determine the calibration signalling based on a comparison between the analog input signal 103 and the digital output signal 102 for a known analog input signal for determination of the calibration signalling for an offset. Thus, the calibration module may be configured to provide a known input signal at 103 or may control circuitry (not shown) to effect this. For example, a zero input signal should, if the voltage and/or current offsets of the converter arrangement 101 are set correctly, yield a zero digital output signal at 102. If there is a deviation, the calibration module 115 may generate appropriate calibration signalling to make an adjustment to the offset of one or more of the components. Accordingly, the calibration module 104 may form part of a feedback loop.

In one or more examples, the calibration module may be configured to calculate an average of the digital output signal provided at 102 over time for determination of an offset. The calibration module may be configured to expect a random signal at the input 103 and therefore an average of the random signal may be equal to zero over a sufficient sampling period. This random signal may be the actual, real time, signal from the sensor. Accordingly, if there is a deviation from zero or other expected average, the calibration module 115 may generate appropriate calibration signalling to make an adjustment to the offset of one or more of the components.

In one or more examples, the calibration module 104 may be configured to make a comparison between the analog input signal and the digital output signal for at least two known analog input signals. Alternatively, a known voltage may be applied in addition to whatever the analog input signal happens to be such that the known voltage comprises a component of the analog input signal. A comparison between two known component parts of the analog input signal followed by averaging may be used to determine the presence of an offset.

The comparison between different input signal levels may provide for determination of the gain of one or more of the components of the converter arrangement. Accordingly, based on the comparison and an expected difference, the calibration module 116 may generate appropriate calibration signalling to make an adjustment to the gain of one or more of the components.

In one or more examples, the calibration module 104 may be configured to perform statistical analysis of the digital output signal to identify changes from expected behaviour of the converter arrangement. Based on detection of a deviation, the calibration module 104 may generate appropriate calibration signalling to make an adjustment to the offset and/or gain of one or more of the components.

In one or more examples, the ADC 100 is configured to provide said diagnostic information during fabrication testing based on a test analog input signal. For example, the output pins 107 may be provided for quality control fabrication based testing or as a Built In Self Test (BIST) function.

In one or more examples, the ADC 100 may be configured to provide said diagnostic information in real time during operation of the analog-to-digital converter. Thus, the output pins 108 may be provided to provide diagnostic information in real time during operation of the ADC 100. A fault determination module 200 (shown in FIG. 2) comprising a functional safety monitor may be connected to the pins 108 for receiving the diagnostic information. Examples of the fault conditions on which it may determine a fault are described above.

Thus, in this example, the calibration module 104 is configured to periodically provide the diagnostic information for use in determining the occurrence of a fault in the ADC 100. On detection of a fault, a fault signal 301 generated by the fault determination module 300 based on the diagnostic information may be used to one or more of i) alert a user; ii) shut down a device of which the ADC 100 forms part, iii) reset a device of which the ADC 100 forms part; iv) provide for the resetting of the ADC 100, and v) provide for the shutting down of the ADC 100 among others.

FIG. 3 shows the combination of the ADC 100 and fault determination module 300 comprising part of a radar device or automotive radar device 302. It will be appreciated that other components may be present for providing the radar device's functionality. The radar device may provide for indication to a user of a fault or provide an indication to circuitry configured to monitor its operation based on the diagnostic information or fault signal at 301.

As mentioned above, the form of the converter arrangement 101 may differ between different forms of ADC 100. FIG. 2 shows a more generalised example embodiment and like reference numerals have been used for like parts. In this example, the convertor arrangement 101 is shown as a single block configured to generate the digital output 102 based on the analog input at 103 using one or more components (not visible). One or more of the components that form the convertor arrangement 101 may be controllable by way of adjustment of one or more of their offset or gain. The one or more components may be controllable to adjust their function in performing their component part of the process to convert the analog signal to a digital one. The calibration signalling generated by the calibration module 104 is provided to actuators 115, 116, which are configured to apply the required signals based on the calibration signalling to the one or more components of the converter arrangement 101. As in FIG. 1, the calibration module is configured to provide the diagnostic information as an output at 107, 108 for use in determining the occurrence of a fault in the analog-to-digital converter 200. The combination of FIG. 3 may equally show the combination of the ADC 200 and the fault determination module 300 comprising part of a radar device or automotive radar device 302.

FIG. 4 shows a method of operation of an analog-to-digital converter 100, 200 including a converter arrangement 101 configured to provide a digital output signal as an output of the analog-to-digital converter based on an analog input signal comprising an input to the analog-to-digital converter, the analog-to-digital converter including a calibration module 104 configured to provide calibration signalling to set one or more of a gain of one or more components of the converter arrangement and an offset of one or more components of the converter arrangement, the method comprising:

based on the calibration signalling 401;
providing 402, as an output of the analog-to-digital converter, diagnostic information for use in determining the occurrence of a fault in the analog-to-digital converter 100.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An analog-to-digital converter including a converter arrangement configured to provide a digital output signal as an output of the analog-to-digital converter based on an analog input signal comprising an input to the analog-to-digital converter, the analog-to-digital converter including a calibration module configured to provide calibration signalling to set one or more of a gain of one or more components and an offset of one or more components of the converter arrangement, the calibration module further configured to provide, as an output, diagnostic information based on the calibration signalling for use in determining the occurrence of a fault in the analog-to-digital converter.

2. The analog-to-digital converter of claim 1, wherein the calibration module is configured to provide said diagnostic information to one or more diagnostic output pins of the analog-to-digital converter for connection to a fault determination module for interpretation of the diagnostic information to determine the occurrence of a fault.

3. The analog-to-digital converter of claim 1, wherein the analog-to-digital converter includes a fault determination module configured to receive the diagnostic information from the calibration module and identify the occurrence of a fault within the analog-to-digital based on one or more fault conditions and, on occurrence of a fault, provide, as an output, a fault signal.

4. The analog-to-digital converter of claim 1, including an offset correction module which is, based on the calibration signalling, configured to apply an offset signal to the converter arrangement to compensate for a voltage and/or current offset determined by the calibration module.

5. The analog-to-digital converter of claim 1, including a gain correction module which is, based on the calibration signalling, configured to apply a gain signal to the converter arrangement to adjust the gain thereof.

6. The analog-to-digital converter of claim 1, wherein the calibration module is configured to determine the calibration signalling based on one or more of;
   a comparison between the analog input signal and the digital output signal for a known analog input signal for determination of the offset;
   averaging of the digital output signal over time for determination of an offset;
   a comparison between the analog input signal and the digital output signal for at least two known analog input signals or at least two known component parts of the analog input signal for determination of the gain;
   statistical analysis of the digital output signal for determination of the gain and/or offset.

7. An analog-to-digital converter of claim 1, configured to provide said diagnostic information for in-production testing based on a test analog input signal.

8. An analog-to-digital converter of claim 1, configured to provide said diagnostic information in real time during operation of the analog-to-digital converter.

9. An analog-to-digital converter of claim 1, wherein the convertor arrangement includes one or more of;
   a pre-amplifier configured to provide an amplified output signal based on an input signal;
   a buffer configured to receive the input signal and a feedback signal generated by the convertor arrangement;
   a sampling module configured to sample an analog signal;
   a digital to analog converter configured to output one of a voltage and current that approximates the sampled input signal;
   a Successive-approximation-register configured to implement a Successive approximation algorithm.

10. An analog-to-digital converter of claim 1, wherein the converter arrangement includes a digital-to-analog converter and the calibration signalling is configured to adjust a gain of the digital-to-analog converter by application of a bias signal thereto.

11. An analog-to-digital converter of claim 1, wherein the offset of the converter arrangement is defined by the offset of one or more of a pre-amplifier, a buffer, a comparator and a digital-to-analog converter of the converter arrangement.

12. An analog-to-digital converter of claim 2, wherein the fault determination module comprises a functional safety monitor for receiving the diagnostic information.

13. The analog-to-digital converter of claim 1, in combination with a fault determination module, the fault determination module configured to provide a fault signal based on one or more fault conditions, the fault conditions at least comprising that the diagnostic information indicates that the one or more of a gain and an offset of the converter arrangement are outside a predetermined range of acceptable values.

14. A method of operation of an analog-to-digital converter including a converter arrangement configured to provide a digital output signal as an output of the analog-to-digital converter based on an analog input signal comprising an input to the analog-to-digital converter, the analog-to-digital converter including a calibration module configured to provide calibration signalling to set one or more of a gain of one or more components of the converter arrangement and an offset of one or more components of the converter arrangement, the method comprising:
   based on the calibration signalling;
   providing, as an output of the analog-to-digital converter, diagnostic information for use in determining the occurrence of a fault in the analog-to-digital converter.

15. A radar device including the analog-to-digital converter of claim 1, the radar device configured to use the digital output of the analog-to-digital converter for providing radar functionality.

* * * * *